(12) United States Patent
Juang et al.

(10) Patent No.: US 6,333,603 B1
(45) Date of Patent: Dec. 25, 2001

(54) ORGANIC LIGHT EMISSION DEVICE DISPLAY MODULE

(75) Inventors: Dar-Chang Juang; Kun-Wei Lin, both of Hsinchu (TW)

(73) Assignee: Sunplus Technology Co., Ltd. (TW)

( * ) Notice: Subject to any disclaimer, the term of this patent is extended or adjusted under 35 U.S.C. 154(b) by 0 days.

(21) Appl. No.: 09/597,258

(22) Filed: Jun. 19, 2000

(51) Int. Cl.[7] ....................................................... G09G 3/10
(52) U.S. Cl. .................................. 315/169.3; 315/169.1; 315/169.2; 315/169.4; 313/496; 313/505
(58) Field of Search ............................... 315/169.3, 169.1, 315/169.4, 169.2; 313/505, 496

(56) References Cited

U.S. PATENT DOCUMENTS

| 4,459,514 | * | 7/1984 | Morimoto et al. | 315/169.1 |
| 5,142,388 | * | 8/1992 | Watanabe et al. | 313/496 |
| 5,793,163 | * | 8/1998 | Okuda | 315/169.3 |
| 5,962,970 | * | 10/1999 | Yokoi et al. | 313/506 |

* cited by examiner

Primary Examiner—Don Wong
Assistant Examiner—Jimmy T. Vu
(74) Attorney, Agent, or Firm—Lowe Hauptman Gilman & Berner, LLP

(57) ABSTRACT

An organic light emission display module is formed by an organic light emission device panel and a driving circuit board. In manufacturing the organic light emission device panel, electrodes are extended to the edges of the panel. The bonding pads are produced by forming aluminum films. The driving circuit board is made of thin printed circuit board, and bonding pads are manufactured at the edges of the printed circuit board, which are corresponding to the bonding pads of the organic light emission device panel, respectively. The driving circuit board is adhered to the organic light emission device panel, and the each bonding pad of the organic light emission device panel is connected to a respective bonding pad of the driving circuit board. Epoxy resin is filled into the bonding area and gaps between the printed circuit board and the organic light emission device panel.

17 Claims, 6 Drawing Sheets

ORGANIC LIGHT EMISSION DEVICE DISPLAY MODULE

BACKGROUND OF THE INVENTION

1. Field of the Invention

The present invention relates to the field of organic light emission devices, and especially to an organic light emission device display module having an organic light emission device panel and a driving circuit board connected to the organic light emission device panel by bonding wires.

2. Description of Related Art

An organic light emission device (hereinafter abbreviated as OLED) is an electronic element capable of converting electrical energy into light energy for output. The operating principle of the OLED is very similar to that of a light emitting diode (LED). FIG. 14 shows a circuit diagram of an OLED panel formed by a plurality of OLEDs 901. Each OLED 901 has two ends connected to an $InTiO_3$ (hereinafter abbreviated as ITO) electrode 902 and an aluminum electrode 903, respectively. As such, by applying current to the electrodes 902 and 903, the OLEDs 901 are controlled to emit light. Since illuminated light generated by the OLED 901 is approximately proportional to the working current thereof, the driving current applied to the OLED panel is generally very large. Therefore, the resistance of a connection between the OLED panel and a driving circuit must be relatively low to avoid the current loss and sustaining the uniform of illumination.

With reference to FIG. 15, in conventional skill, the connection between the OLED panel 900 and driving circuit is achieved by a tape carrier (TC) manner. That is, a soft aluminum foil board 905 is provided as a conductor tape for connecting the OLED panel 900 with a printed circuit board (hereinafter abbreviated as PCB) (not shown) having the driving circuit. By adhering the joint points at one end of the soft aluminum board 905 to the electrodes 902 and 903 of the OLED panel 900, the OLED panel 900 is electrically connected to the driving circuit. Alternatively, a chip that includes the driving circuit may be adhered to the soft aluminum board 905 by welding in using the tap automatic bonding (TAB) technique. However, in the above conventional skill, the soft aluminum foil board 905 is too expensive and the cost for TAB package is relatively high. Furthermore, the package dimension can not be decreased due to the large aluminum foil board, which results in a difficulty in the miniaturization of OLED products. In addition, since the relatively long conductor tape is carried with a large driving current necessary by the OLEDs. It is likely to result in a current loss due to a large resistance of the conductor tape, and also cause an electromagnetic interference (hereinafter abbreviated as EMI) problem. Therefore, it is desired to have a novel OLED display module that can mitigate and/or obviate the aforementioned problems.

SUMMARY OF THE INVENTION

Accordingly, the primary object of the present invention is to provide a low-cost and miniaturized OLED display module that does not cause the current loss and EMI problems.

To achieve the above object, the OLED display module in accordance with the present invention includes an OLED panel and a driving circuit board. The OLED panel has a plurality of electrodes extended to edges of the OLED panel for forming a plurality of first bonding pads, respectively. The driving circuit board has a driving circuit for driving the OLED panel, and a plurality of second bonding pads connected to the driving circuit. The plurality of second bonding pads of the driving circuit board are arranged with respect to the plurality of first bonding pads of the OLED panel, and each of the second bonding pads is connected to a respective first bonding pad by a bonding wire.

The various objects and advantages of the present invention will be more readily understood from the following detailed description when read in conjunction with the appended drawing.

DESCRIPTION OF THE PREFERRED EMBODIMENTS

Figure 1:
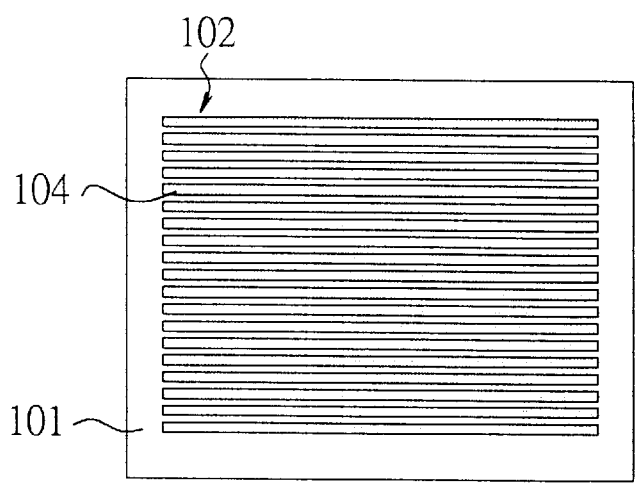
FIG. 1 is a schematic view showing that the transparent electrodes are formed on a glass substrate for producing an OLED panel used in the present invention.
Figure 2:
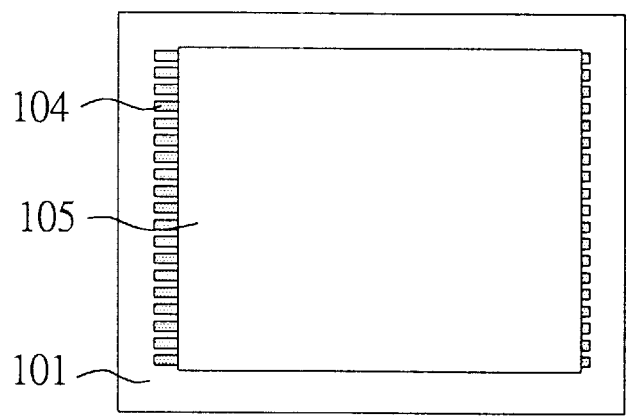
FIG. 2 is a schematic view showing that an organic light emission film is formed on the glass substrate for producing the OLED panel used in the present invention.

One preferred embodiment of the OLED display module in accordance with the present invention may refer to FIGS. 1 to 5, wherein the manufacturing process of an OLED panel is illustrated. As shown in FIG. 1, at first, a plurality of lateral transparent electrodes 102 are formed on a glass substrate 101. It is preferred that the transparent electrode 102 is an ITO electrode. Each transparent electrode 102 has an end 104 extended to an edge of the glass substrate 102. Next, as shown in FIG. 2, by using a technique such as vapor deposition, an organic light emission film 105 is formed on the surface of the glass substrate 101 that is formed with the transparent electrodes 102, such that the transparent electrodes 102 are substantially covered, except that the extended ends 104 are exposed.

Figure 3:
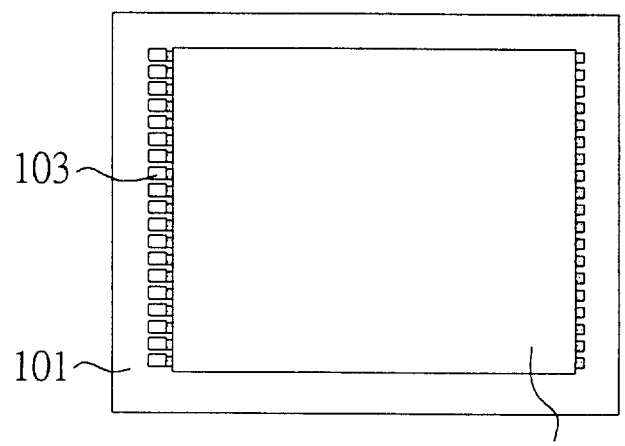
FIG. 3 is a schematic view showing that a chromium layer is formed on the glass substrate for producing the OLED panel used in the present invention.
Figure 4:
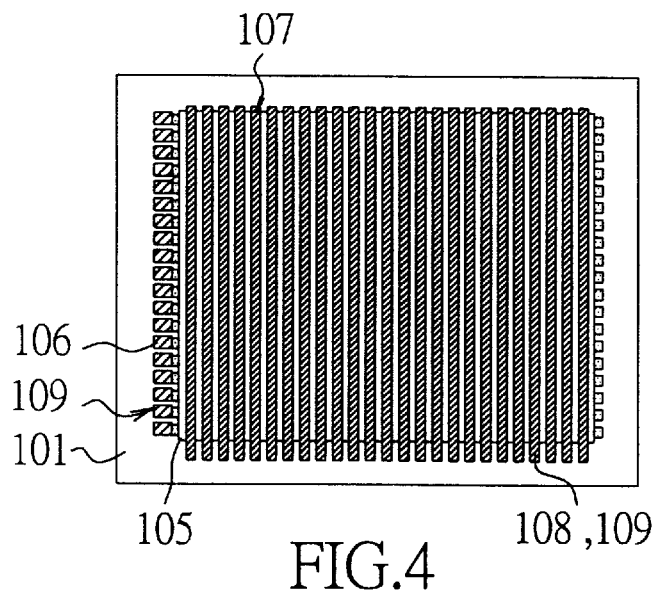
FIG. 4 is a schematic view showing that the metal electrodes are formed on the glass substrate for producing the OLED panel used in the present invention.

FIG. 3 shows that each extended end 104 of the transparent electrode 102 is formed with a chromium (Cr) layer 103. Then, as shown shown in FIG. 4, a plurality of longitudinal metal electrode 107 are further formed on the organic light emission film 105 by, for example, vapor deposition technique. It is preferred that the metal electrodes 107 are aluminum electrodes. Each metal electrode 107 has an end 108 protruded out of the organic light emission film 105, and extended to another edge of the glass substrate 101, so that the extended end 108 of the metal electrodes 107 are provided as a bonding pad 109. In this manufacturing process of forming the aluminum metal electrodes 107, a metal film 106 made of the same material as that of the metal electrodes 107 are formed on the chromium layer 103 at the extended end 104 of the transparent electrode 102 for being provided as a bonding pad 109. In this preferred embodiment, the metal film 106 is an aluminum film. Because the chromium can be securely bonded to the $InTiO_3$, the aluminum metal film 106 is thus securely combined with the transparent electrode 102, so as to form a bonding pad 109 capable of bonding wires.

Figure 5:
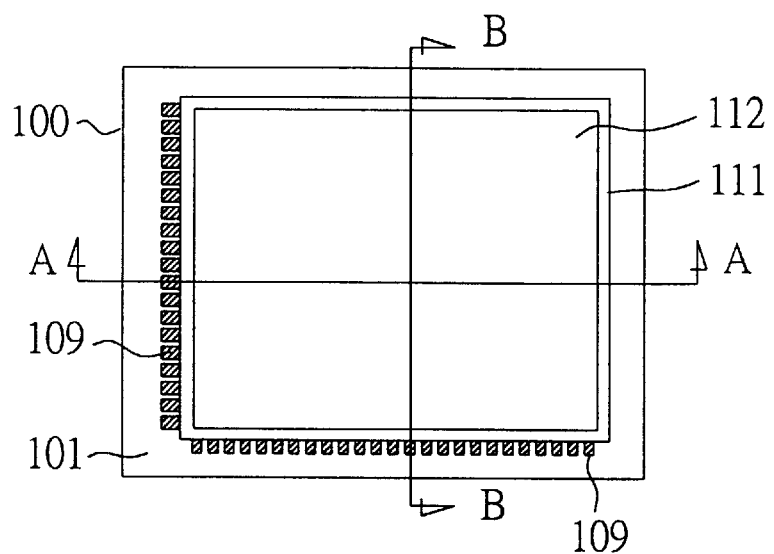
FIG. 5 is a schematic view showing that an insulation coating and light shield film are formed on the glass substrate for producing the OLED panel used in the present invention.
Figure 7:
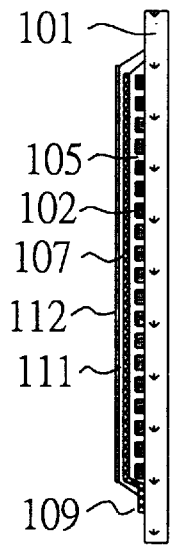
FIG. 7 is a cross sectional view showing the OLED panel of FIG. 5 by taking along the sectional line B—B.
Figure 6:
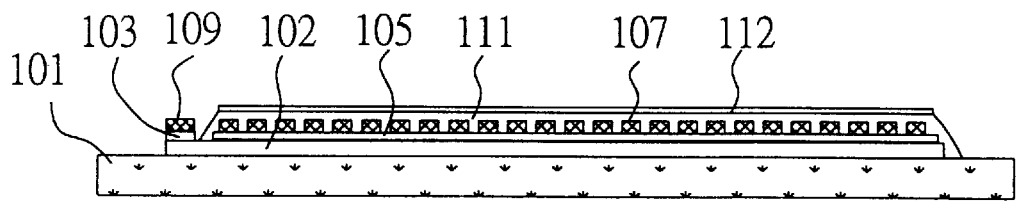
FIG. 6 is a cross sectional view showing the OLED panel of FIG. 5 by taking along the sectional line A—A.

Then, with reference to the FIGS. 5, 6, and 7, an insulation coating 111 and a light shield film 112 are sequentially formed on the part of the glass substrate 101 that is formed with the organic light emission film 105, so as to provide a protection and light-shield capability. Furthermore, the bonding pads 109 are exposed out of the insulation coating 111 and light shield film 112 for being connected to a driving circuit. As a result, an OLED panel 100 having the electrodes 102 and 107 extended to the edges of the panel for forming bonding pads 109 is provided.

Figure 8:
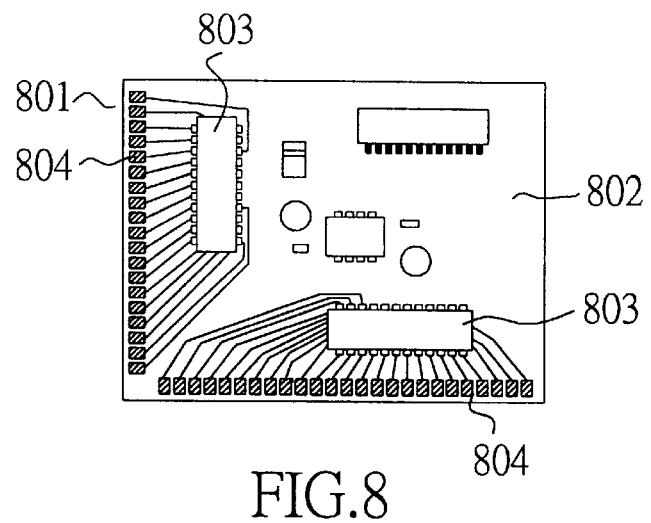
FIG. 8 is a plane view showing the driving circuit board used in the first embodiment of the present invention.
Figure 9:
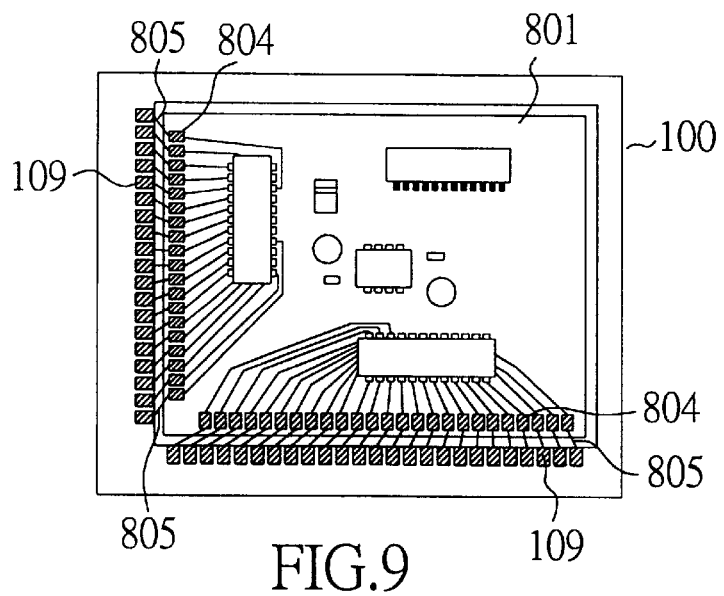
FIG. 9 is a plane view showing the OLED display module in accordance with the first embodiment of the present invention.
Figure 10:
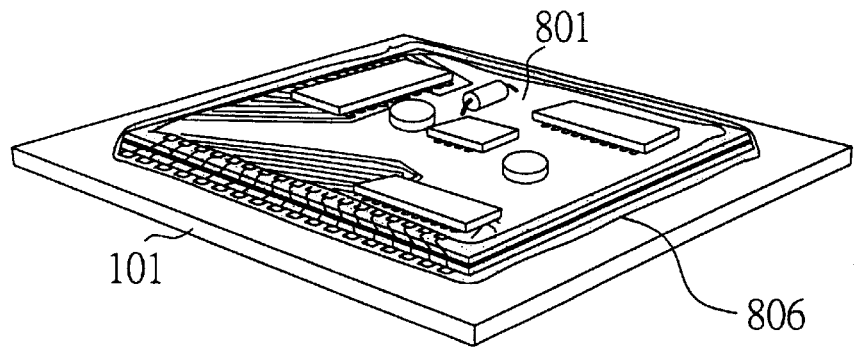
FIG. 10 is a perspective view of the OLED module in accordance with the first embodiment of the present invention.

This OLED panel 100 can be electrically connected to a driving circuit board, which has a driving circuit to drive the OLED panel 100, by bonding wires. With reference to FIG. 8, the driving circuit board 801 is made of thin PCB 802, which is installed with a driving circuit formed by driver chips 803. On two edges of the PCB 802, a plurality of bonding pads 804 are formed and connected to the driving circuit. These bonding pads 804 are arranged with respect to the bonding pads 109 of the OLED panel 100. As shown in FIG. 9, the driving circuit board 801 can be overlapped and adhered to the OLED panel 100, and the bonding pads 109 of the OLED panel 100 are connected to the bonding pads 804 of the driving circuit board 801, respectively, by bonding wires 805. Then, as shown in FIG. 10, encapsulation material 806, such as epoxy resin, is filled into the bonding area where the bonding wires 805 are arranged, and the gaps between the driving circuit board 801 and the OLED panel 100, so as to protect the bonding wires 805 and secure the OLED panel 100 to the driving circuit board 801. As such, an OLED display module in accordance with the present invention is completed. Because the OLED panel 100 is electrically connected to the driving circuit board 801 by very short bonding wires 805, there is no need to have the large and expensive soft aluminum foil board, as generally employed in the conventional skill. Accordingly, a low-cost and miniaturized OLED display module can be manufactured without the current loss and EMI problems, so as to enhance the performance of the OLED display module significantly.

Figure 11:
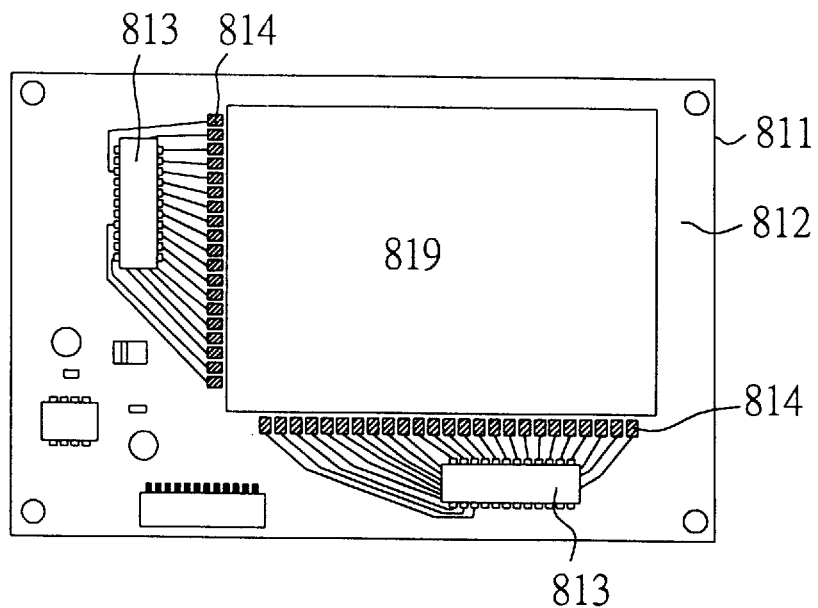
FIG. 11 is a plane view of the driving circuit board used in the second embodiment of the present invention.
Figure 12:
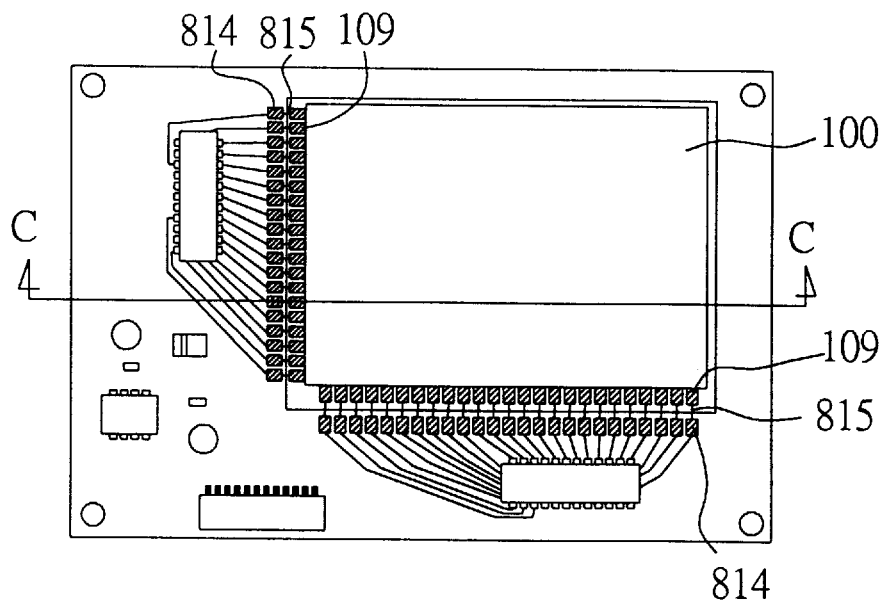
FIG. 12 is a plane view of the OLED display module in accordance with the second embodiment of the present invention.
Figure 13:
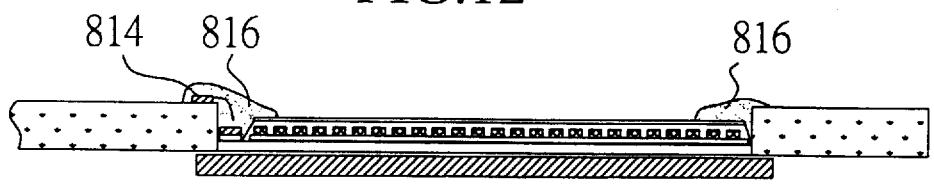
FIG. 13 is a cross sectional view of the OLED display module in accordance with the second embodiment of the present invention shown in FIG. 12 by taking along the sectional line C—C.
Figure 14:
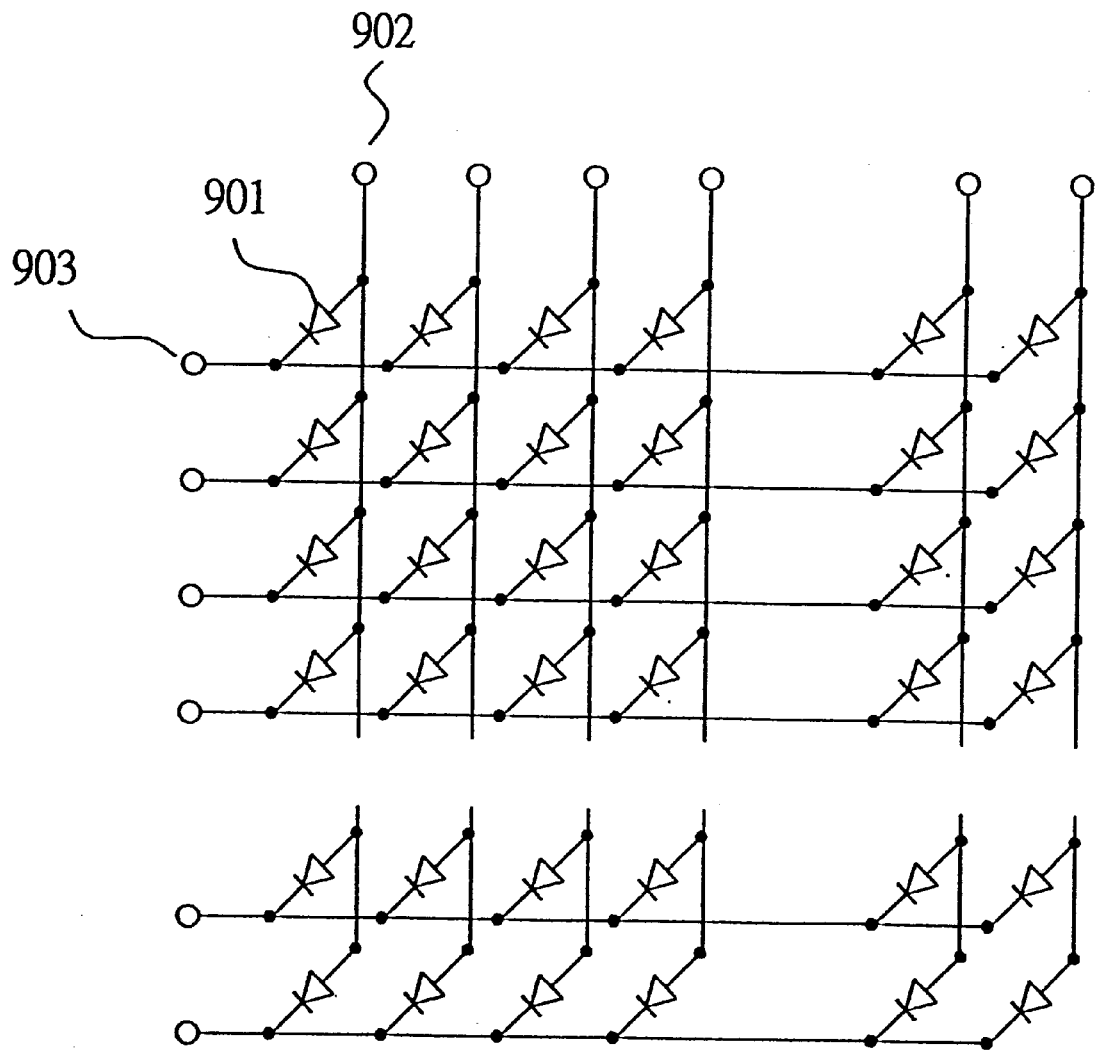
FIG. 14 is a circuit diagram of a conventional OLED panel.
Figure 15:
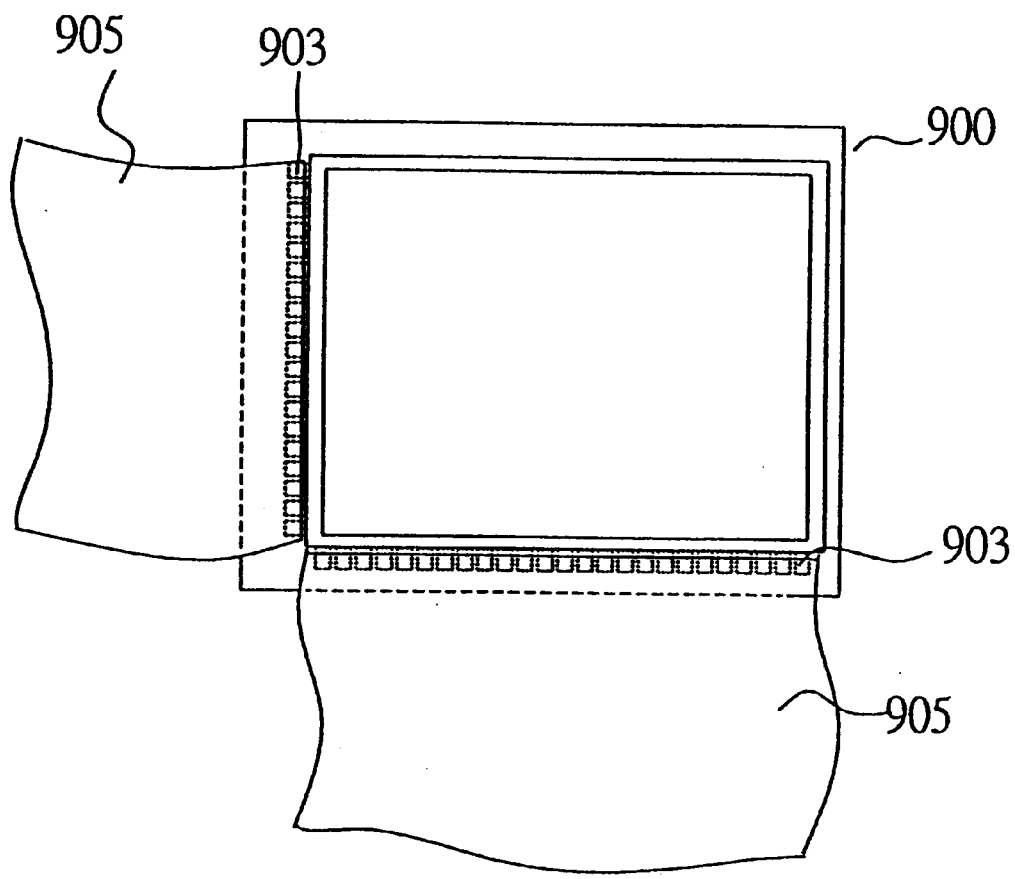
FIG. 15 is a schematic view showing the connection between an OLED panel and a driving circuit board in prior art.

FIG. 11 shows a driving circuit board 811 used in another preferred embodiment of the present invention. The driving circuit board 811 is also made of a thin PCB 812, which is installed with a driving circuit formed by driver chips 813. The PCB 812 defines an aperture 819, which has a dimension slightly smaller than that of the OLED panel 100. On two internal edges of the PCB 812 near the aperture 819, a plurality of bonding pads 814 are formed and connected to the driving circuit. These bonding pads 814 are arranged with respect to the bonding pads 109 of the OLED panel 100. As shown in FIG. 12, the driving circuit board 801 can be substantially installed in the aperture 819 and adhered to the driving circuit board 811, and the bonding pads 109 of the OLED panel 100 are connected to the bonding pads 814 of the driving circuit board 811, respectively, by bonding wires 815. Then, as shown in FIG. 13, encapsulation material 816, such as epoxy resin, is filled into the bonding area where the bonding wires 815 are arranged, and the gaps between the driving circuit board 811 and the OLED panel 100, so as to protect the bonding wires 815 and secure the OLED panel 100 to the driving circuit board 811. As a result, an OLED display module having the same function as the previous embodiment but with a small thickness is completed.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An organic light emission device display module comprising:

an organic light emission device panel having a plurality of electrodes extended to edges of the organic light emission device panel for forming a plurality of first bonding pads, respectively; and a driving circuit board having a driving circuit for driving the organic light emission device panel, and a plurality of second bonding pads connected to the driving circuit, wherein the plurality of second bonding pads of the driving circuit board are arranged with respect to the plurality of first bonding pads of the organic light emission device panel, and each of the second bonding pads is connected to a respective first bonding pad by a bonding wire.

2. The organic light emission device display module as claimed in claim 1, wherein the plurality of second bonding pads are formed at an edge of the driving circuit board.

3. The organic light emission device display module as claimed in claim 2, wherein the organic light emission device panel is overlapped on the driving circuit board.

4. The organic light emission device display module as claimed in claim 3, wherein the electrodes of the organic light emission device panel includes a plurality of transparent electrodes and a plurality of metal electrodes, each transparent electrode having an extended end formed thereon a metal film, so as to be provided as the first bonding pad.

5. The organic light emission device display module as claimed in claim 4, wherein the metal electrode is an aluminum electrode and the metal film is an aluminum film.

6. The organic light emission device display module as claimed in claim 5, wherein the extended end of each transparent electrode is first formed with a chromium layer, and then formed with the aluminum film.

7. The organic light emission device display module as claimed in claim 6, wherein the aluminum film and the aluminum electrode are formed in the same manufacturing process.

8. The organic light emission device display module as claimed in claim 3, wherein encapsulation material is filled to a bonding area where the bonding wires are arranged, and gaps between the organic light emission device panel and the driving circuit board.

9. The organic light emission device display module as claimed in claim 8, wherein the encapsulation material is epoxy resin.

10. The organic light emission device display module as claimed in claim 1, wherein the driving circuit board defines an aperture, and the plurality of second bonding pads are formed at an internal edge of the driving circuit board near the aperture.

11. The organic light emission device display module as claimed in claim 10, wherein the organic light emission device panel is installed in the aperture of the driving circuit board.

12. The organic light emission device display module as claimed in claim 11, wherein the electrodes of the organic light emission device panel includes a plurality of transparent electrodes and a plurality of metal electrodes, each transparent electrode having an extended end formed thereon a metal film, so as to be provided as the first bonding pad.

13. The organic light emission device display module as claimed in claim 12, wherein the metal electrode is an aluminum electrode and the metal film is an aluminum film.

14. The organic light emission device display module as claimed in claim 13, wherein the extended end of each transparent electrode is first formed with a chromium layer, and then formed with the aluminum film.

15. The organic light emission device display module as claimed in claim 14, wherein the aluminum film and the aluminum electrode are formed in the same manufacturing process.

16. The organic light emission device display module as claimed in claim 11, wherein encapsulation material is filled to a bonding area where the bonding wires are arranged, and gaps between the organic light emission device panel and the driving circuit board.

17. The organic light emission device display module as claimed in claim 16, wherein the encapsulation material is epoxy resin.

* * * * *